(12) United States Patent
Kim

(10) Patent No.: US 6,579,774 B2
(45) Date of Patent: Jun. 17, 2003

(54) SEMICONDUCTOR DEVICE FABRICATION METHOD

(75) Inventor: Yong Chan Kim, Choongcheongbuk-Do (KR)

(73) Assignee: Hyundai Electronics Industries Co., Ltd., Ichon-shi (KR)

(*) Notice: Subject to any disclaimer, the term of this patent is extended or adjusted under 35 U.S.C. 154(b) by 0 days.

(21) Appl. No.: 10/123,423

(22) Filed: Apr. 17, 2002

(65) Prior Publication Data

US 2002/0110990 A1 Aug. 15, 2002

Related U.S. Application Data

(62) Division of application No. 09/538,242, filed on Mar. 30, 2000, now abandoned.

(30) Foreign Application Priority Data

Apr. 19, 1999 (KR) .............................................. 99-3787

(51) Int. Cl.$^7$ .............................................. H01L 21/331
(52) U.S. Cl. .................... 438/363; 438/362; 438/348
(58) Field of Search .................... 438/341, 348, 438/363, 365, 362

(56) References Cited

U.S. PATENT DOCUMENTS

| | | | |
|---|---|---|---|
| 4,824,794 A | * 4/1989 | Tabata et al. ............... | 438/363 |
| 4,851,362 A | 7/1989 | Suzuki | |
| 4,853,342 A | * 8/1989 | Taka et al. ................... | 438/283 |
| 4,884,123 A | 11/1989 | Dixit et al. | |
| 5,001,533 A | 3/1991 | Yamaguchi | |
| 5,128,271 A | * 7/1992 | Bronner et al. ............. | 438/348 |
| 5,500,378 A | * 3/1996 | Yoshihara ................... | 438/366 |
| 6,060,365 A | 5/2000 | Kim | |

OTHER PUBLICATIONS

Wolf, "Silicon Processing for the VLSI, vol. 3—The Submicron MOSFET," 1995, Lattice Press, vol. 3, p. 323–324.

* cited by examiner

Primary Examiner—Trung Dang
(74) Attorney, Agent, or Firm—Fleshner & Kim, LLP

(57) ABSTRACT

A semiconductor device fabrication method includes the steps of forming a first insulation layer and a first semiconductor layer sequentially on a semiconductor substrate having a buried diffusion region therein. A second insulation layer is formed on the first semiconductor layer. The first insulation layer, the first semiconductor layer, and the second insulation layer are then patterned to create openings that expose the buried diffusion region. A third insulation layer is formed on respective side walls of the openings on the exposed portions of the first semiconductor layer, first insulation layer and second insulation layer that form the openings. A first epitaxial layer is formed on the semiconductor substrate exposed through the openings. A second epitaxial layer is then formed on the first epitaxial layer to be connected to the first semiconductor layer, thereby forming an active base region and a second conductive type collector region in the second epitaxial layer of the first and second openings. A second semiconductor layer is then formed over the entire structure. Portions of the second semiconductor layer are oxidized using an oxidation mask, to form insulator portions. An emitter electrode, a base electrode and a collector electrode are formed on the portions of the second semiconductor layer that correspond to the emitter region, the base region and the collector region. The portions of the second semiconductor layer that are not oxidized form contact plugs that connect the first semiconductor layer and the electrodes.

10 Claims, 5 Drawing Sheets

SEMICONDUCTOR DEVICE FABRICATION METHOD

This application is a Divisional of application Ser. No. 09/538,242 filed Mar. 30, 2000, now abandoned.

BACKGROUND OF THE INVENTION

1. Field of the Invention

The present invention relates to a semiconductor device fabrication method, and more particularly, to a bipolar semiconductor device fabrication method.

2. Background of the Related Art

Among related self-alignment techniques applicable for implementing high speed operation, U.S. Pat. No. 4,851,362 discloses a selective epitaxial layer growth and a floating base formation method to decrease a junction capacitance between a base and a collector. This method provides an ultra high speed device capable of decreasing a parasitic capacitance between the base and collector (N+ buried diffusion region) by thickening an insulation layer of a lower portion of a floating base polysilicon layer. This results in a bipolar semiconductor device fabrication technique applicable to a radio frequency semiconductor circuit.

According to the related art technique, a polysilicon base electrode layer is formed on a predetermined region of a silicon substrate, and an insulation layer is formed on side walls of the polysilicon layer. First and second epitaxial layers are selectively grown on the exposed surface of the silicon substrate to connect to the polysilicon layer. An active base and an emitter are formed in the epitaxial layers so that the epitaxial layers are used as a base pull-out electrode. The related art device operation is identical to that of a known bipolar transistor having base, emitter and collector electrodes.

However, the first epitaxial layer may become too thick, for example, as thick as an oxide layer formed below the base electrode. This thickness may cause deteriorating high speed characteristics of the device. In other words, a thin collector layer operates effectively under low power, unless the first epitaxial layer becomes too thick.

Further, when an emitter and a collector polycrystalline silicon electrode are deposited, the emitter region is opened and an unnecessary portion of the polycrystalline silicon electrode is etched, possibly causing deterioration in step coverage characteristics during subsequent metallic wiring steps.

The above references are incorporated by reference herein where appropriate for appropriate teachings of additional or alternative details, features and/or technical background.

SUMMARY OF THE INVENTION

An object of the present invention is to substantially obviate one or more of the problems, and limitations and disadvantages of the related art.

Another object of the present invention is to provide a semiconductor device fabrication method capable of improving step coverage characteristics in a metallic wiring process.

The objects of the present invention can be achieved in a whole, or in part, by forming a semiconductor device with a method that includes the steps of forming a first insulation layer and a semiconductor layer sequentially over a semiconductor substrate having a buried diffusion region. A second insulation layer is formed over the first semiconductor layer, and the second insulation layer is etched to form a mask. The first semiconductor layer and the first insulation layer are then etched, using the mask, to form first and second openings that expose predetermined portions of the substrate corresponding to the buried diffusion region. Portions of the semiconductor layer and the second insulation layer are selectively etched to expose a predetermined portion of the first insulation layer. A third insulation layer is formed over respective side walls of the exposed first semiconductor layer and the first and second openings. A first epitaxial layer is then formed over the semiconductor substrate exposed through the first and second openings. Portions of the third insulation layer are removed to expose side walls of the first semiconductor layer, and a second epitaxial layer is formed over the first epitaxial layer for connecting to the first semiconductor layer. An active base region and a second conductive type collector region are thus formed in the second epitaxial layer of the first and second openings. A second semiconductor layer is then formed over the entire structure, and portions of the second semiconductor layer are oxidized to form a fifth insulation layer. An emitter region is then formed in the active base region of the first opening. An emitter electrode, a base electrode and a collector electrode are formed over the corresponding emitter region, base region and collector region of the second semiconductor layer by a metallic wiring process.

The objects of the present invention can also be achieved in a whole, or in part, by a semiconductor device including a substrate having a buried diffusion region, a first insulation layer formed over the substrate, the first insulation layer having openings that expose portions of the buried diffusion region, and a base region including a first semiconductor layer formed over predetermined portions of the first insulation layer, and an epitaxial layer formed over an exposed portion of the buried diffusion region and adjacent the first semiconductor layer. The device also includes a collector region having an epitaxial layer formed over another exposed portion of the buried diffusion region. An emitter region is formed in the base region. Contact plugs, formed of portions of a second semiconductor layer, are formed over and connected to the base region, the collector region, and the emitter region. A base electrode, a collector electrode and an emitter electrode, are formed such that each electrode is connected to the contact plug for coupling to the base region, the collector region and the emitter region, respectively.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings, in which like reference numerals refer to like elements, and wherein.

DETAILED DESCRIPTION OF PREFERRED EMBODIMENTS

Figure 1A:
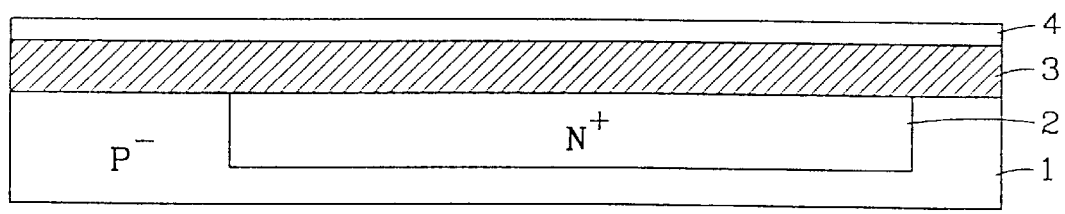
FIGS. 1A through 1N illustrate steps of a method of fabricating a semiconductor device according to a preferred embodiment of the present invention.

FIG. 1A shows a first thick insulation layer 3 formed over a P-type substrate 1 having an N+ buried diffusion region 2.

A first semiconductor layer 4 is formed over the first insulation layer 3. In this example of the preferred embodiment, the first insulation layer 3 includes an oxidation material and the first semiconductor layer 4 includes polycrystalline silicon and is formed using a chemical vapor deposition (CVD) process.

Figure 1B:
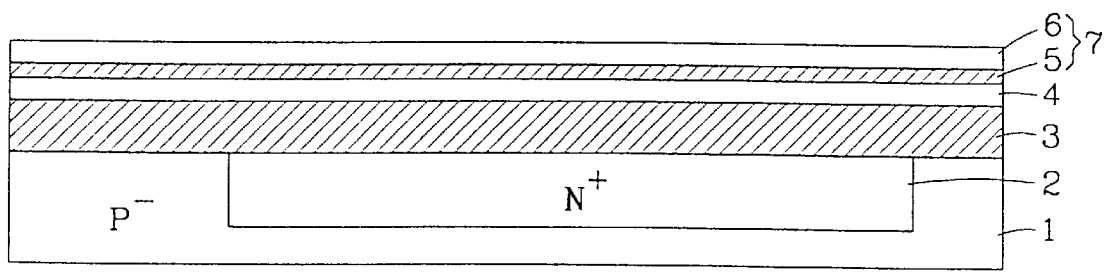

FIG. 1B illustrates a second insulation layer 7 formed on the first semiconductor layer 4. The second insulation layer 7 includes a double film layer of a silicon nitride layer 6 stacked on a silicon oxide layer 5. Here, the silicon oxide layer 5 is formed by a thermal oxidation process or a CVD process, and the silicon nitride layer 6 is formed by a CVD process.

Figure 1C:
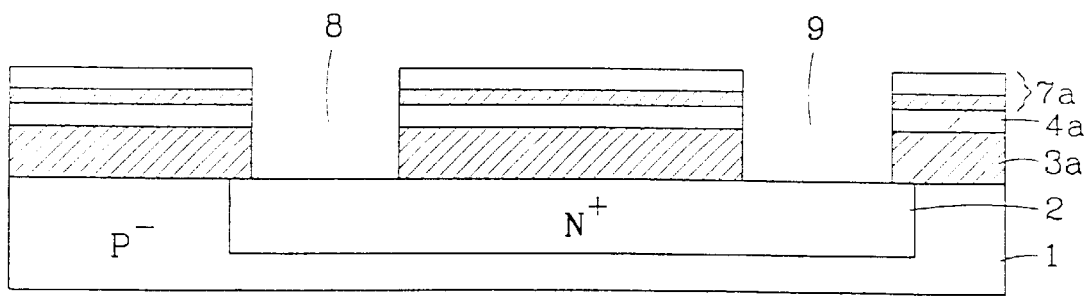

As shown in FIG. 1C, the second insulation layer 7 is patterned using a photo etching process to expose the first semiconductor layer 4, thereby obtaining a second insulation layer pattern 7a. Then, in order to expose the N+ buried diffusion region 2, the first semiconductor layer 4 and the first insulation layer 3 are anisotropically etched, using the second insulation layer pattern 7a as an etching mask, to form a first semiconductor layer pattern 4a and a first insulation layer pattern 3a. As a result, first and second openings 8, 9 are formed through the first insulation layer 7, the first semiconductor layer 4 and the first insulation layer 3. An active base region and a collector electrode region are formed in the first and second openings 8, 9, respectively, and an emitter region is formed in the active base region.

Figure 1D:
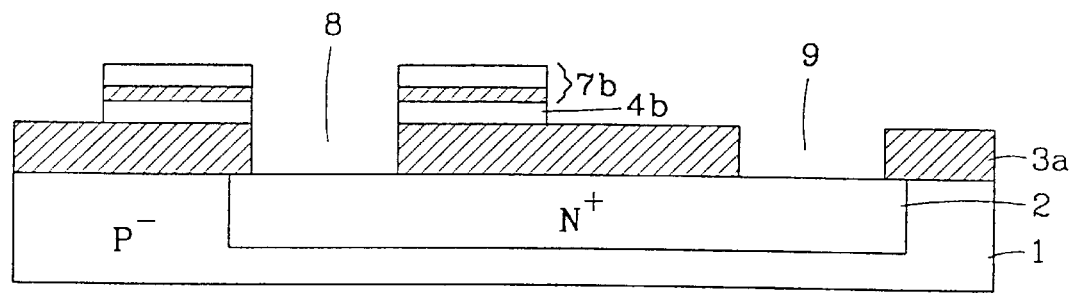

As shown in FIG. 1D, the first semiconductor layer pattern 4a and the second insulation layer pattern 7a are etched using a photo etching process to expose a predetermined region of the first insulation layer pattern 3a. This etching step forms a second semiconductor layer pattern 4b and a second insulation layer pattern 7b. As a result, the first opening 8 becomes bounded by respective side walls of the first insulation layer pattern 3a, the second semiconductor layer pattern 4b and the second insulation layer pattern 7b. In addition, the second opening 9 becomes bounded by the first insulation layer pattern 3a.

Figure 1E:
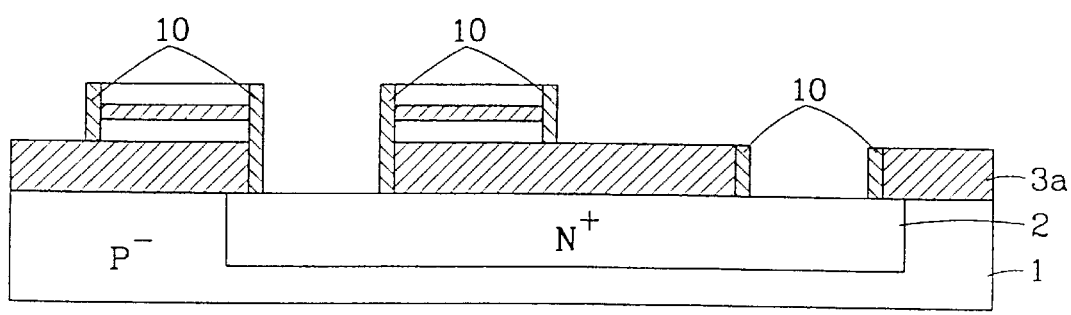

FIG. 1E shows a third insulation layer 10 formed at respective side walls of the exposed second semiconductor layer pattern 4b and the first and second openings 8, 9. In order to obtain the third insulation layer 10, an oxidation material is deposited over the structure shown in FIG. 1D using a CVD or heat oxidation method. The thin insulation layers are then anisotropically etched to form the third insulation layer 10. The third insulation layer 10 helps to prevent a silicon growth on each side wall of the first semiconductor layer pattern 4a during a subsequent epitaxial growth step.

Figure 1F:
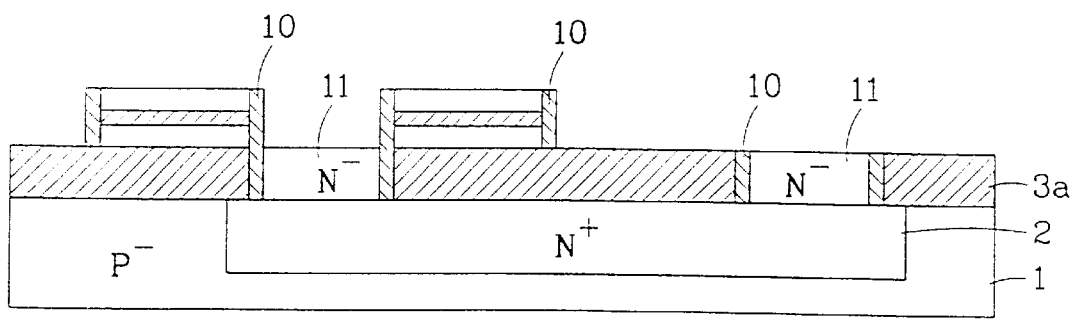

As shown in FIG. 1F, a first N⁻ epitaxial layer 11 is selectively deposited at the exposed surfaces of the N+ buried diffusion region 2 through the first and second openings 8, 9. The first epitaxial layer 11 is formed to have a thickness substantially identical to that of the first insulation layer pattern 3a.

Figure 1G:
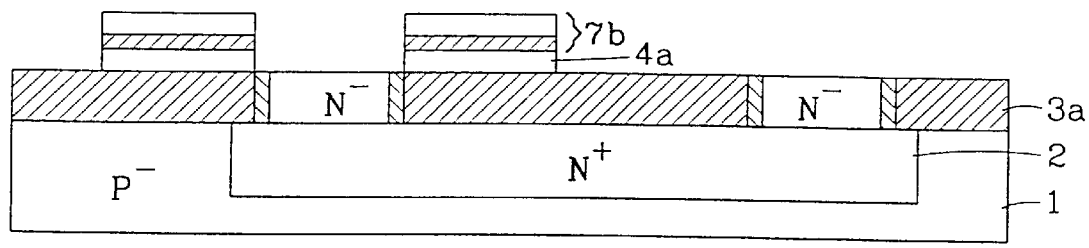
Figure 1H:
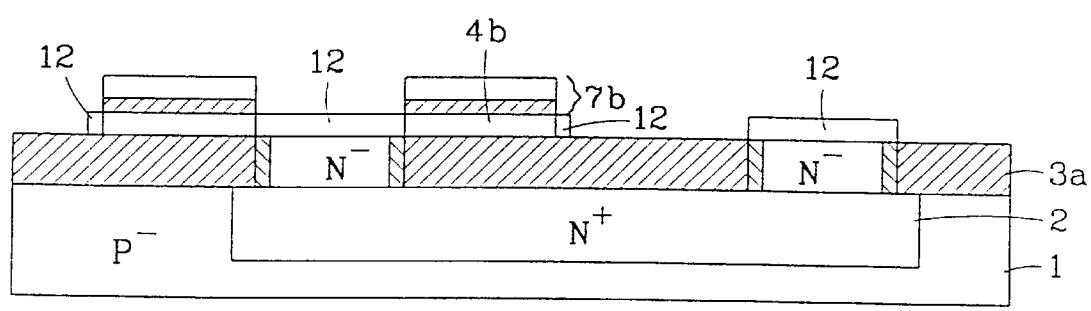

As shown in FIG. 1G, portions of the third insulation layer 10 are removed to expose side walls of the first semiconductor layer pattern 4b. As shown in FIG. 1H, a second N-type epitaxial layer 12 is formed such that it is connected to the first semiconductor layer pattern 4b. The second N-type epitaxial layer 12 is formed on each side wall of the exposed first semiconductor layer pattern 4b and on the first epitaxial layer 11 in the first and second openings 8, 9. The second epitaxial layer 12 is thinner than the first epitaxial layer 11, and its thickness is substantially identical to the thickness of the first semiconductor layer pattern 4b.

Figure 1I:
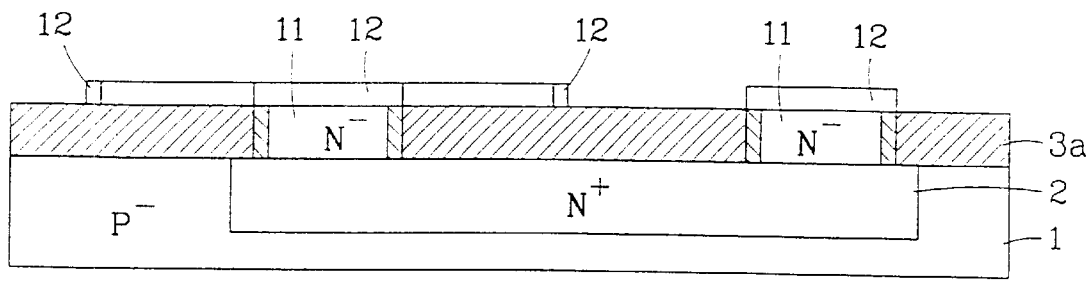
Figure 1J:
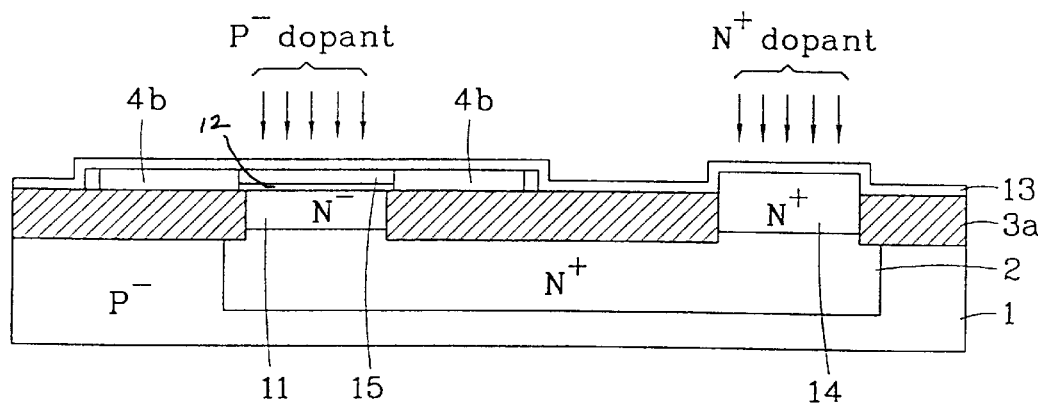

As shown FIG. 1I, the second insulation layer pattern 7b is removed. As shown in FIG. 1J, a fourth insulation layer 13 is formed on the entire surface of the illustrated structure, and P-type and N-type dopants are ion-implanted into the second epitaxial layer 12 to form a N⁺ collector region 14 and a P⁻ active base region 15.

Figure 1K:
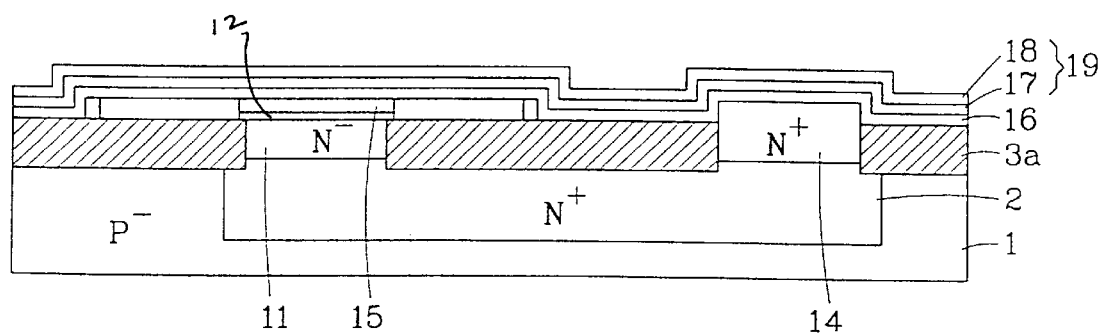

As shown in FIG. 1K, the fourth insulation layer 13 is removed and a second semiconductor layer 16, formed of polycrystalline silicon, is deposited on the entire top surface of the structure shown in FIG. 1J using a CVD process. Also, a fifth insulation layer 19 is formed on the second semiconductor layer 16. The fifth insulation layer 19, like the second insulation layer 7, includes a double film having a silicon nitride layer 19 formed over a silicon oxide layer 17.

Figure 1L:
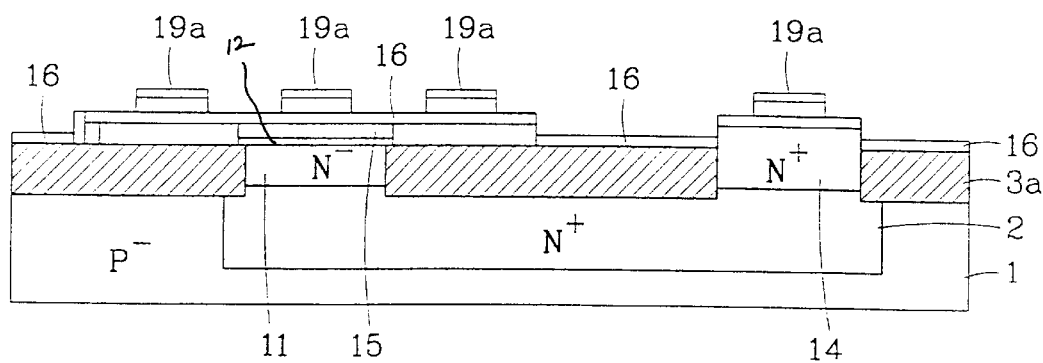

As shown in FIG. 1L, the fifth insulation layer 19 is patterned using a photo etching process to expose predetermined regions of the second semiconductor layer 16, thereby forming a fifth insulation layer pattern 19a. The second semiconductor layer 16 serves as a contact plug for connecting the base region 15 and the collector region 14 to electrodes.

Figure 1M:
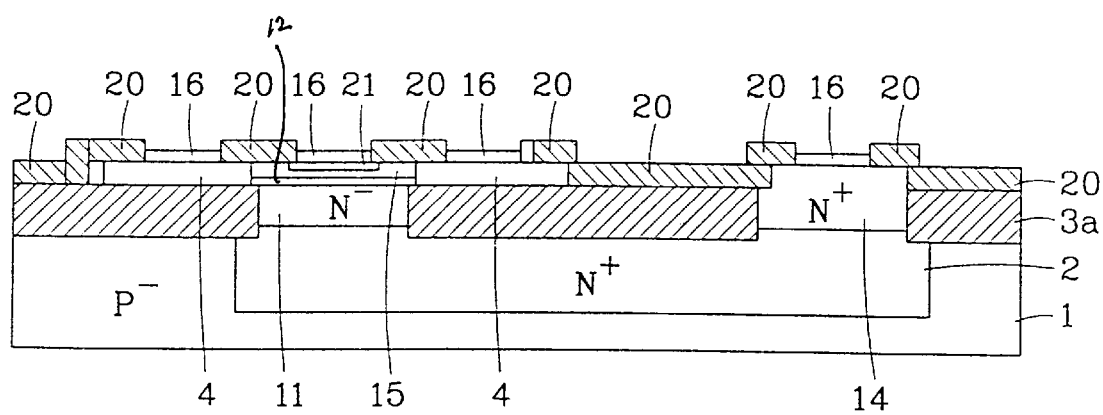

As shown in FIG. 1M, the exposed portions of the second semiconductor layer 16 are oxidized by a LOCOS process, using the fifth insulation pattern 19a as an oxidation mask, to form a sixth insulation layer 20. Then, an N⁻ emitter region 21 is formed in the active base region 15. The sixth insulation layer 20 is a field oxide layer having the shape of a bird's beak at each side end thereof in a preferred embodiment. As shown in FIG. 1M, the sixth insulation layer 20 can also have a substantially rectangular shape.

Next, a P-type dopant is ion-implanted into the regions of the second semiconductor layer 16 that corresponds to the active base region 15, and an N-type dopant is ion-implanted into the regions of the second semiconductor layer 16 which corresponds to the emitter region 21 and the collector region 14.

Figure 1N:
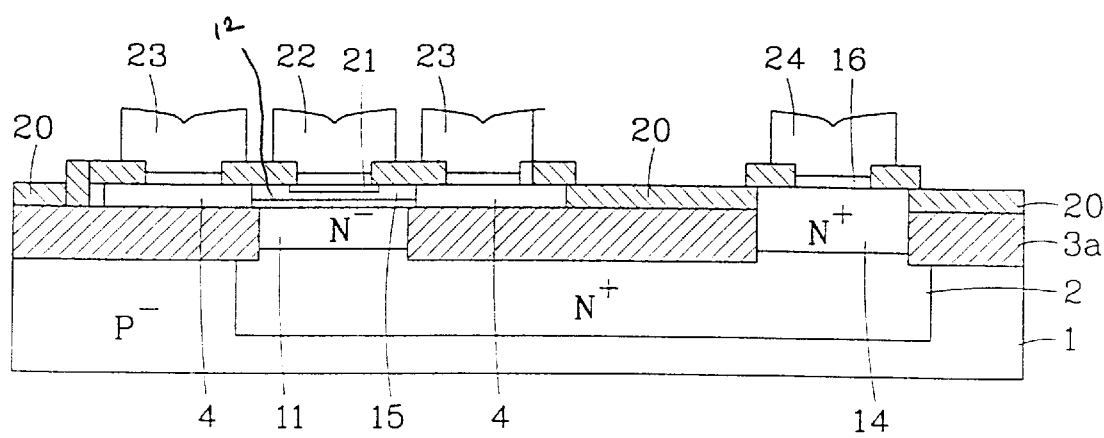

FIG. 1N illustrates an emitter electrode 22, a collector electrode 24 and base electrodes 23 formed on regions of the second semiconductor layer 16 corresponding to the emitter region 21, the collector region 14 and the first semiconductor layer 4 using a metallic wiring step. The base electrodes 23 become pull-out electrodes electronically connected to the base region 15 through the regions of the second semiconductor layer 16 that are connected to the first semiconductor layer 4.

As described above, the semiconductor device fabrication method according to the present invention improves a step coverage in a metallic wiring step by using the second semiconductor layer 16 as a contact plug that connects the emitter, base and collector regions 21, 15, and 14 to the emitter, base and collector electrodes 22, 23, and 24 corresponding thereto.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A semiconductor device fabrication method, comprising:

forming a first insulation layer and a first semiconductor layer sequentially over a semiconductor substrate having a buried diffusion region therein;

forming a second insulation layer over the first semiconductor layer;

etching the second insulation layer, the first semiconductor layer and the first insulation layer to form first and second openings that expose predetermined portions of the substrate corresponding to the buried diffusion region;

etching and patterning the first semiconductor layer and the second insulation layer selectively so as to expose a predetermined portion of the first insulation layer;

forming a third insulation layer on respective side walls of the exposed first semiconductor layer and the first and second openings;

selectively forming a first epitaxial layer over the semiconductor substrate exposed through the first and second openings;

removing portions of the third insulation layer to expose side walls of the first semiconductor layer;

selectively forming a second epitaxial layer over the first epitaxial layer for connecting to the first semiconductor layer;

forming an active base region and a second conductive type collector region in the portions of the second epitaxial layer;

forming a second semiconductor layer over exposed portions of the first insulation layer, the second conductive type collector region, the second epitaxial layer, the first semiconductor layer, and the active base region;

forming a fourth insulation layer over the second semiconductor layer;

patterning the fourth insulation layer;

oxidizing exposed portions of the second semiconductor layer to form a fifth insulation layer using the patterned fourth insulation layer as an oxidation mask;

forming an emitter region in the active base region; and forming an emitter electrode, a base electrode and a collector electrode on the portions of the second semiconductor layer respectively corresponding to the emitter region, the base region and the collector region.

2. The method of claim 1, wherein the first and third insulation layers are formed of silicon oxide using a chemical vapor deposition process.

3. The method of claim 1, wherein the first and second semiconductor layers are formed of silicon oxide using a chemical vapor deposition process.

4. The method of claim 1, wherein the second and fourth insulation layers are formed of a double film with a silicon nitride layer stacked on a silicon oxide layer.

5. The method of claim 1, wherein the fifth insulation layer is a field oxide layer.

6. The method of claim 5, wherein the field oxide layer insulates the emitter, base and collector electrodes and the second semiconductor layer.

7. The method of claim 1, wherein the first epitaxial layer is a collector region and the second epitaxial layer is a base region.

8. The method of claim 1, wherein the device is formed such that a height of an upper surface of the first epitaxial layer is substantially equal to a height of a lower surface of the first semiconductor layer.

9. The method of claim 1, wherein the device is formed such that a thickness of the second epitaxial layer is substantially equal to a thickness of the first semiconductor layer.

10. The method of claim 1, wherein the second semiconductor layer is a contact plug that electronically connects the base electrode to the base region connected to the first semiconductor layer.

* * * * *